(12) United States Patent
McHugh et al.

(10) Patent No.: US 6,181,568 B1
(45) Date of Patent: Jan. 30, 2001

(54) ELECTRICAL APPARATUS

(75) Inventors: Robert G. McHugh, Evergreen, CO (US); Yao-Chi Huang, Yung-Ho (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/138,188

(22) Filed: Aug. 21, 1998

(51) Int. Cl.[7] ................................................ H05K 7/16
(52) U.S. Cl. ...................... 361/760; 361/801; 361/679; 361/683; 439/73; 439/342; 174/260
(58) Field of Search ................................. 361/760, 801, 361/679, 683, 686, 785; 439/73, 331, 342; 174/260

(56) References Cited

U.S. PATENT DOCUMENTS

| | | | |
|---|---|---|---|
| 5,443,591 | * 8/1995 | Tsai | 439/342 |
| 5,650,917 | * 7/1997 | Hsu | 361/759 |
| 5,721,673 | * 2/1998 | Klein | 361/809 |
| 5,989,049 | * 11/1999 | Walkup et al. | 439/342 |
| 6,004,141 | * 12/1999 | Abe et al. | 439/73 |
| 6,004,152 | * 12/1999 | Walkup et al. | 439/342 |
| 6,017,234 | * 1/2000 | Walkup et al. | 439/266 |
| 6,022,236 | * 2/2000 | McHugh et al. | 439/342 |
| 6,042,413 | * 3/2000 | Hsiao et al. | 439/342 |
| 6,056,601 | * 5/2000 | Pollock et al. | 439/630 |
| 6,065,990 | * 5/2000 | McHugh et al. | 439/342 |

* cited by examiner

*Primary Examiner*—Jeffrey Gaffin
*Assistant Examiner*—David Foster

(57) ABSTRACT

An electrical apparatus comprises an electrical device including at least a first terminal. A carrier for electrically connecting the electrical device to a printed circuit board having at least a conductive contact includes a bridging terminal disposed between the first terminal and the conductive contact. The bridging terminal is arranged to be selectively displaced between a first position at which the first terminal and the conductive contact are not connected, and a second position at which the first terminal and the conductive contact are electrically connected by the bridging terminal.

21 Claims, 15 Drawing Sheets

ELECTRICAL APPARATUS

FIELD OF THE INVENTION

The present invention relates to an electrical apparatus, and more particularly to an electrically apparatus for electrically assembling a CPU device to a printed circuit board.

DESCRIPTION OF PRIOR ART

Conventional ZIF sockets are used for assembling a CPU to a printed circuit board. The socket generally comprises a base member including an array of contacting terminals, and a cover member defining an array of through holes corresponding to the contacting terminals. The cover member is movable with respect to the base member. An end of each contacting terminal is soldered into a mounting hole of the PCB. The ZIF socket includes actuation means for selectively displacing the cover member between a first position and a second position. When the cover member is at the first position, connecting pins of the CPU are easily inserted into the corresponding holes, i.e. zero-insertion-force. When the actuating means is actuated, the cover member is moved to the second position thereby electrically connecting each pin of the CPU with the corresponding contacting terminal. The CPU is secured in the socket when the cover member is at the second position.

ZIF sockets function properly when the CPU is small. When the CPU becomes increasingly powerful, such as the Intel Pentium Series, heat dissipation becomes a critical factor for functional operation of the CPU. To address this problem, a heat sink and cooling fan assembly is attached to an upper face of the CPU for dissipating heat generated thereby to ensure normal operation of the CPU. However, operation of the cooling fan generates vibrations. The vibrations caused by the cooling fan are negligible when the heat sink and cooling fan assembly is small since the vibrations do not adversely affect the electrical connection between the CPU and the socket. However, the heat sink and cooling fan assembly for Intel Pentium series or other high performance CPUs is large and heavier than conventional heat sink and cooling fan assemblies. Accordingly, vibrations caused by the larger heat sink and cooling fan assembly adversely affect the electrical connection between the connecting pins of the CPU and the connecting terminals of the socket.

In order to solve this problem, a retainer is used to secure the CPU to a frame thereby ensuring reliable electrical connection between the connecting pins of the CPU and the connecting terminals of the socket. However, once the CPU is held stationary, the conventional ZIF socket is of no use because it is impossible to move the connecting pins of the CPU by means of the cover member.

SUMMARY OF THE INVENTION

An objective of this invention is to provide an electrical apparatus for electrically assembling a stationary CPU to a printed circuit board whereby a slide member thereby an electrical connection between connecting pins of the CPU and conductive contacts of a printed circuit board can be attained by bridging terminals carried on a slide member of the apparatus.

In order to achieve the objective set forth, an electrical apparatus in accordance with the present invention comprises an electrical device including at least a first terminal. A carrier for electrically connecting the electrical device to a printed circuit board including at least a conductive contact includes at least a bridging terminal disposed between the first terminal and the conductive contact. The bridging terminal is arranged to be selectively displaced between a first position at which the first terminal and the conductive contact are not connected, and a second position at which the first terminal and the conductive contact are electrically connected by the bridging terminal.

According to another embodiment of an electrical apparatus for electrically assembling a CPU to a printed circuit board, the CPU forming an array of first terminal comprises a base member securely assembled to the printed circuit board. The base member includes an array of metal posts corresponding to the array of first terminals. An end of each metal post is electrically connected to a conductive contact of the printed circuit board. A cover member is securely assembled to the base member and a receiving slot is defined between the cover and base members. The cover member defines an array of through holes corresponding to the array of first terminals of the base member. A slide member is movably arranged within the receiving slot and defines an array of terminal cells corresponding to the array of first terminals. Each cell securely receives a bridging terminal therein. The slide member is selectively displaced between a first position at which the first terminal is not electrically connected with the metal post, and a second position at which the first terminal is electrically connected with the metal post by the bridging terminal.

These and additional objectives, features, and advantages of the present invention will become apparent after reading the following detailed description of the preferred embodiments of the invention taken in conjunction with the appended drawing figures.

DETAILED DESCRIPTION OF THE PREFERRED EMBODIMENT

Figure 1:
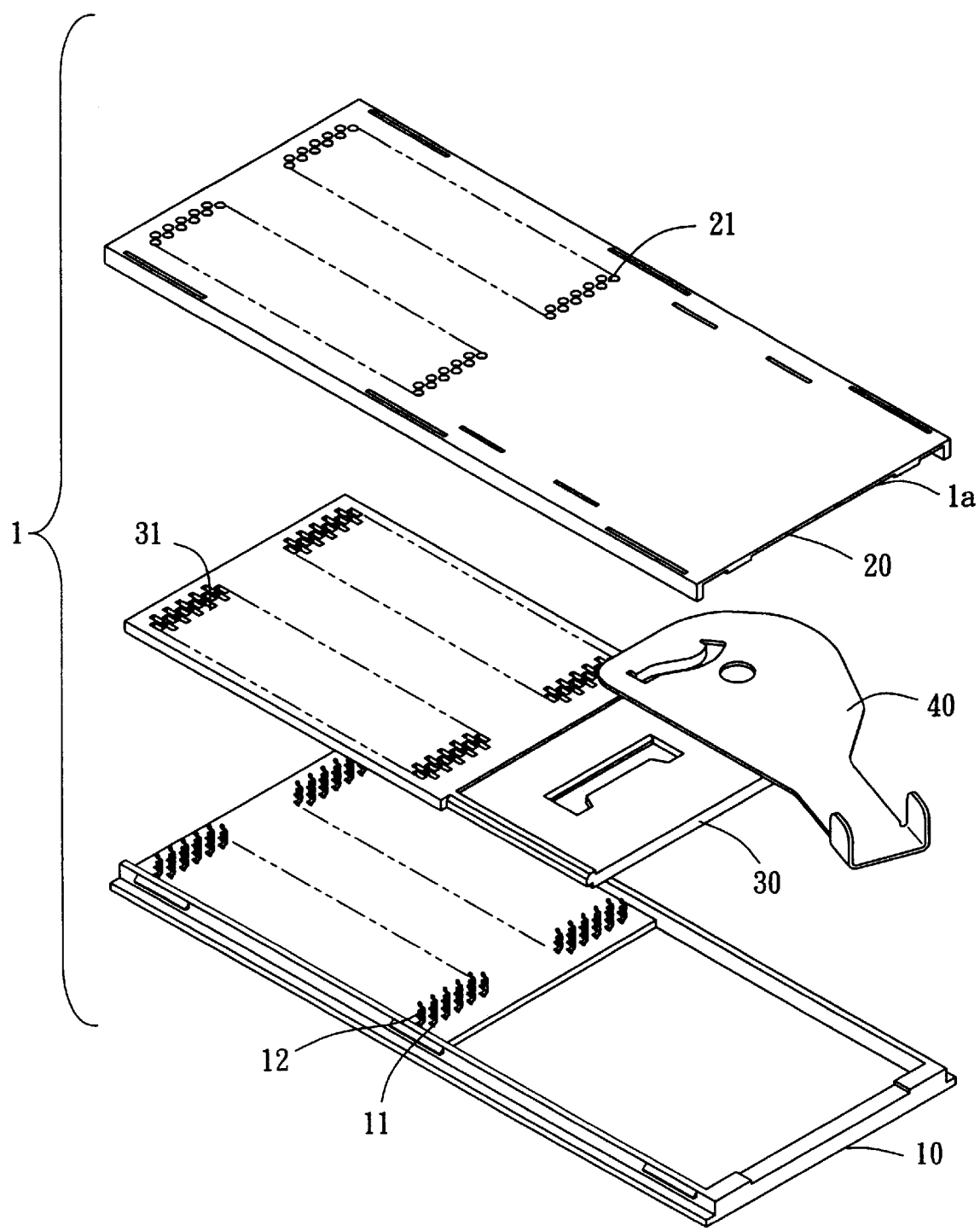
FIG. 1 is an exploded view of an electrical apparatus in accordance with a first embodiment of the present invention.
Figure 2A:
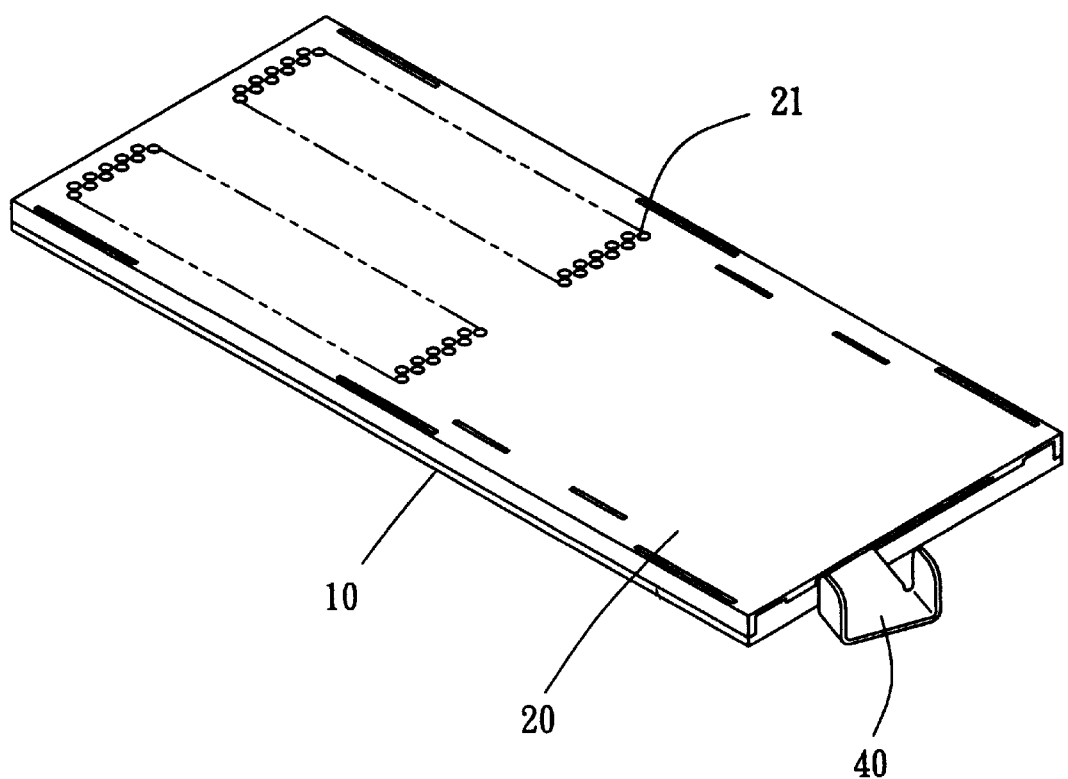
FIG. 2A is an assembled view of the electrical apparatus of FIG. 1.
Figure 2B:
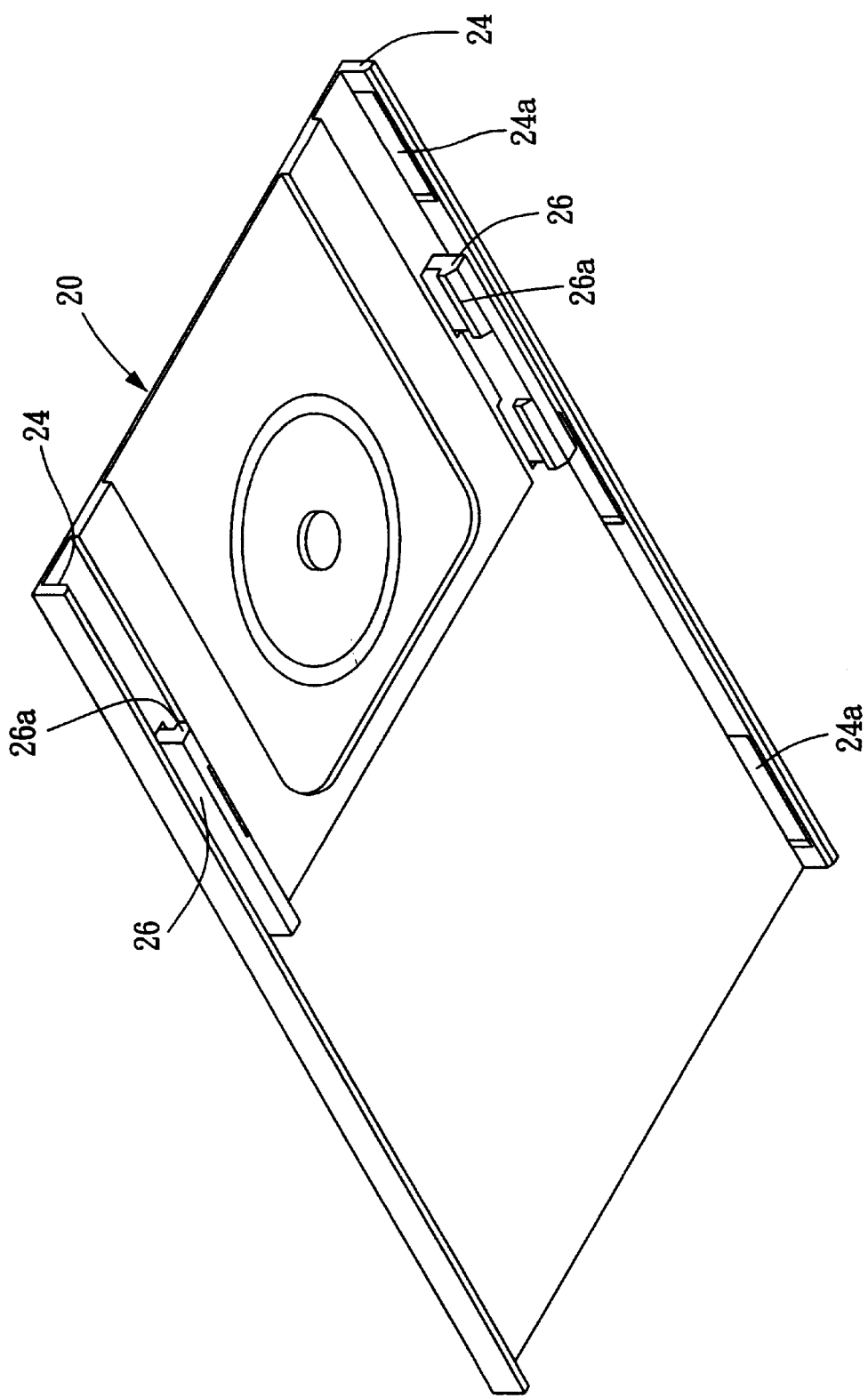
FIG. 2B is a bottom view of a cover member of FIG. 1.

Referring to FIGS. 1, 2A, and 2B, a first embodiment of an electrical apparatus 1 in accordance with the present invention comprises a base member 10 and a cover member 20 fixedly assembled to the base member 10. A receiving slot 1a is defined between the base member 10 and the cover member 20, and a slide member 30 is movably disposed therein.

The cover member 20 defines an array of through holes 21 corresponding to connecting pins 31 (FIG. 3A) of a CPU (not shown). Each through hole 21 forms a flared entrance (221a of FIG. 5D) for facilitating easy insertion of the connecting pin 51 of the CPU. The slide member 30 defines an array of terminal cells 31 corresponding to the array of through holes 21. The base member 10 defines an array of passageways 11 each receiving a metal post 12 therein. An end 12a (FIG. 3A) of each metal post 12 contacts a conductive pad of a printed circuit board (not shown) through a BGA 70 (FIG. 5C). Of course, LGA or other suitable connecting means can also be applied.

Figure 2C:
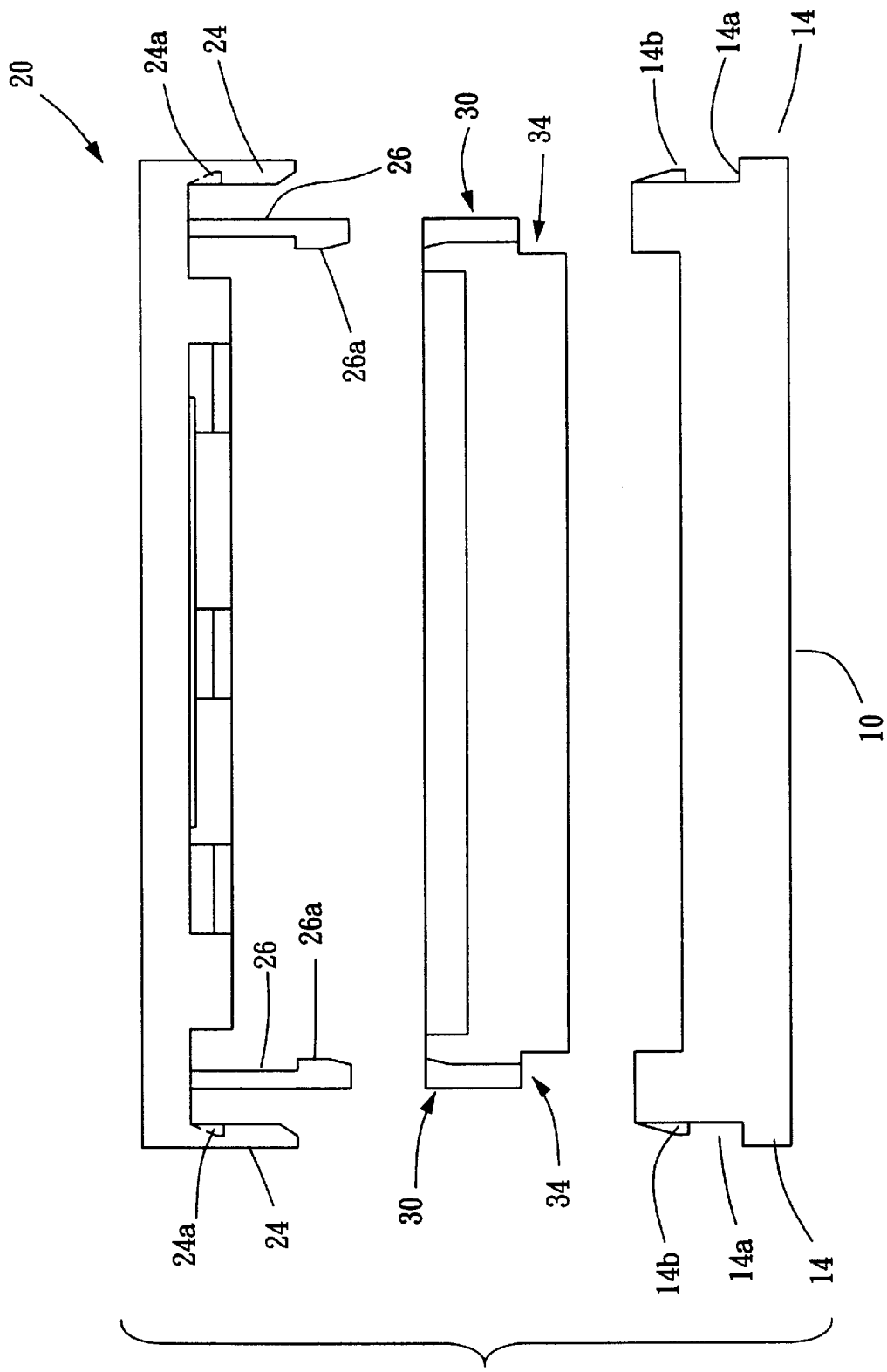
FIG. 2C is an end view of the electrical apparatus of FIG. 1.

Actuating means 40 is arranged between the cover member 20 and the slide member 30 to displace the slide member 30 between a first position and a second position. The movable engagement between the base member 10, the slide member 30, and the cover member 20 is facilitated by fastening means. Referring to FIGS. 2B and 2C, the base member 10 forms a pair of retaining flanges 14 extending from opposite lower longitudinal sides thereof. Retaining wedges 14b are formed extending from upper longitudinal side of the base member 10 thereby defining a retaining channel 14a between each retaining flange 14 and the corresponding wedge 14b. The slide member 30 forms a pair of guiding grooves 34 at transverse sides thereof. The cover member 20 forms a pair of first locking flanges 24 extending from transverse sides thereof. Each first locking flange 24 defines a retaining recesses 24a in an inner wall thereof corresponding to the retaining wedges 14b of the base member 10. The retaining wedges 15 engage the corresponding retaining recesses 24a when the first locking flange 24 is received in the retaining channel 14b of the base member 10. The cover member 20 further forms a pair of second locking flanges 26 extending downward. Each second locking flange 26 forms a locking end 26a on an end thereof. The locking end 26a is movably received within the guiding groove 34 of the slide member 30 whereby the slide member 30 is movable with respect to the cover member 20 and the base member 10.

Figure 3A:
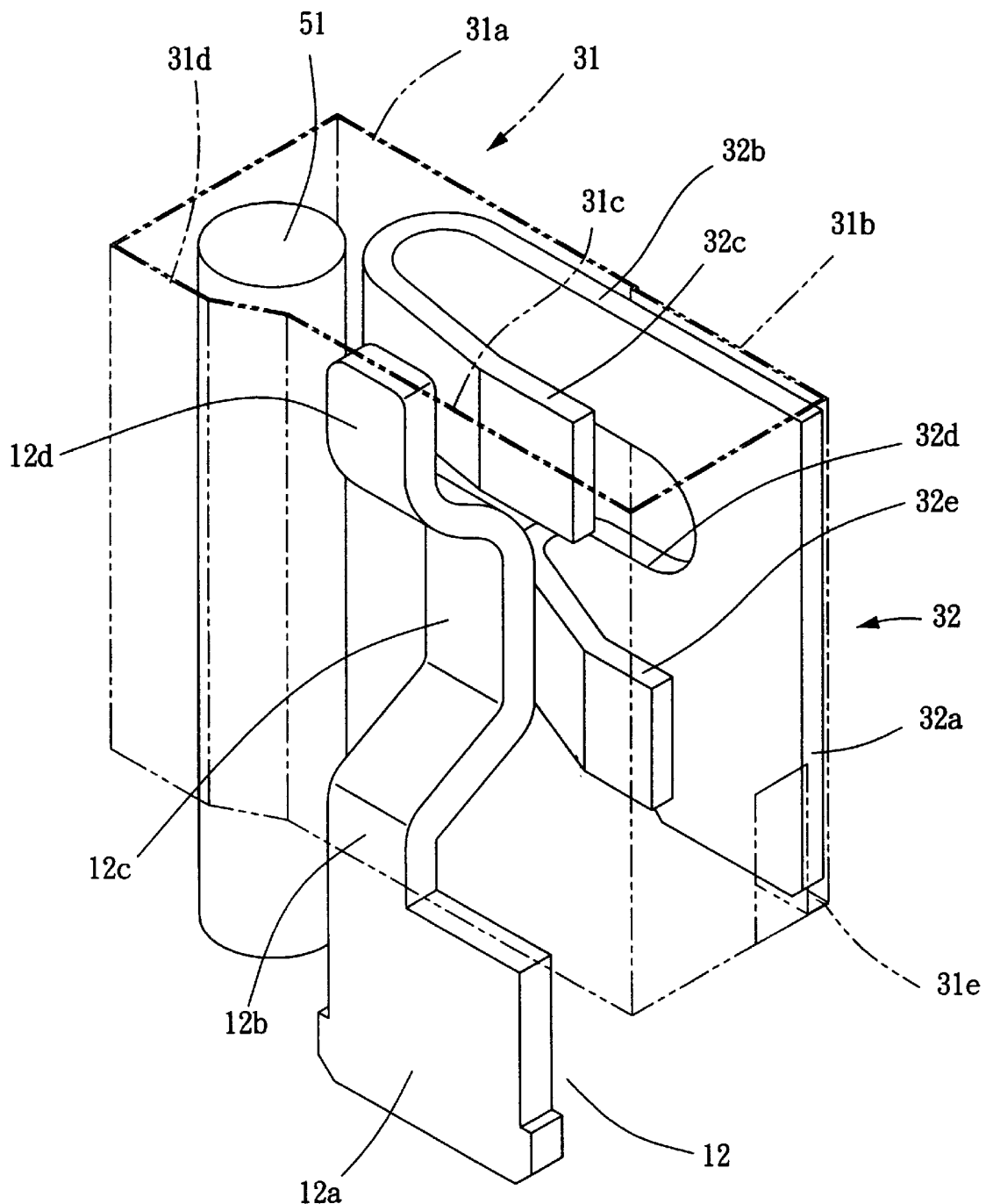
FIG. 3A is a perspective view of a terminal cell of a slide member at which a connecting pin of a CPU, a metal post of a base member, and a bridging terminal of a slide member are arranged therein.

Referring to FIG. 3A, each terminal cell 31 has a cubic configuration with an enlarged portion 31a and a tail portion 31b. The connecting pin 51 of the CPU is inserted into the enlarged portion 31a. The metal post 12 projecting from the base member 10 is inserted into the tail portion 31b. Each metal post 12 forms a leg portion 12a rooted in the corresponding passageway 11 of the base member 10. A connecting portion 12b extends from the leg portion 12a and forms a bulge section 12c. An end 12d of the connection portion 12b abuts an inner surface 31c of the cell 31. The enlarged portion 31a is defined by an inclined face 31d which facilitates insertion of the connecting pin 51.

Figure 3B:
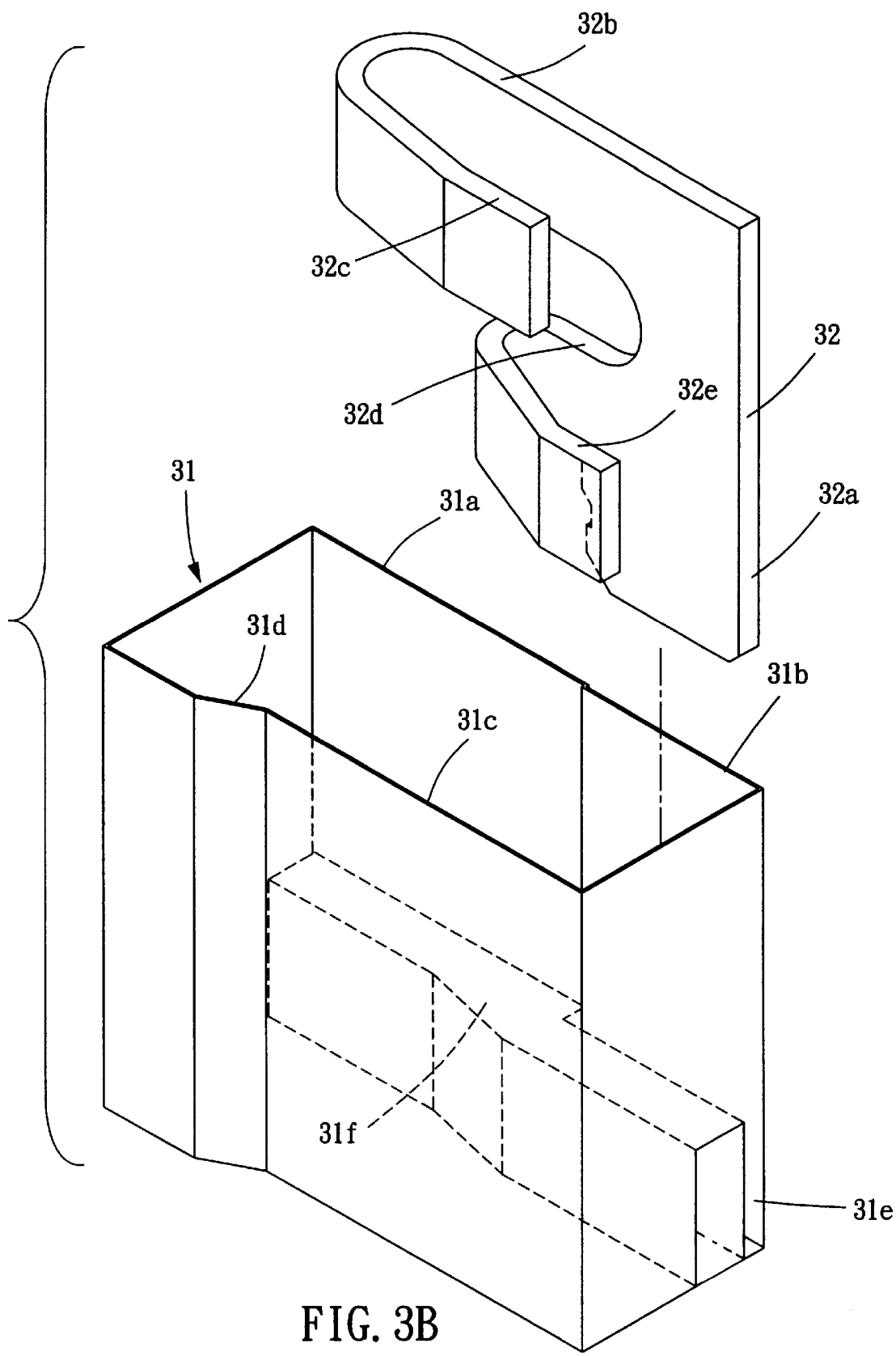
FIG. 3B is a perspective view of the bridging terminal and the terminal cell before the bridging terminal is seated within the terminal cell.
Figure 3C:
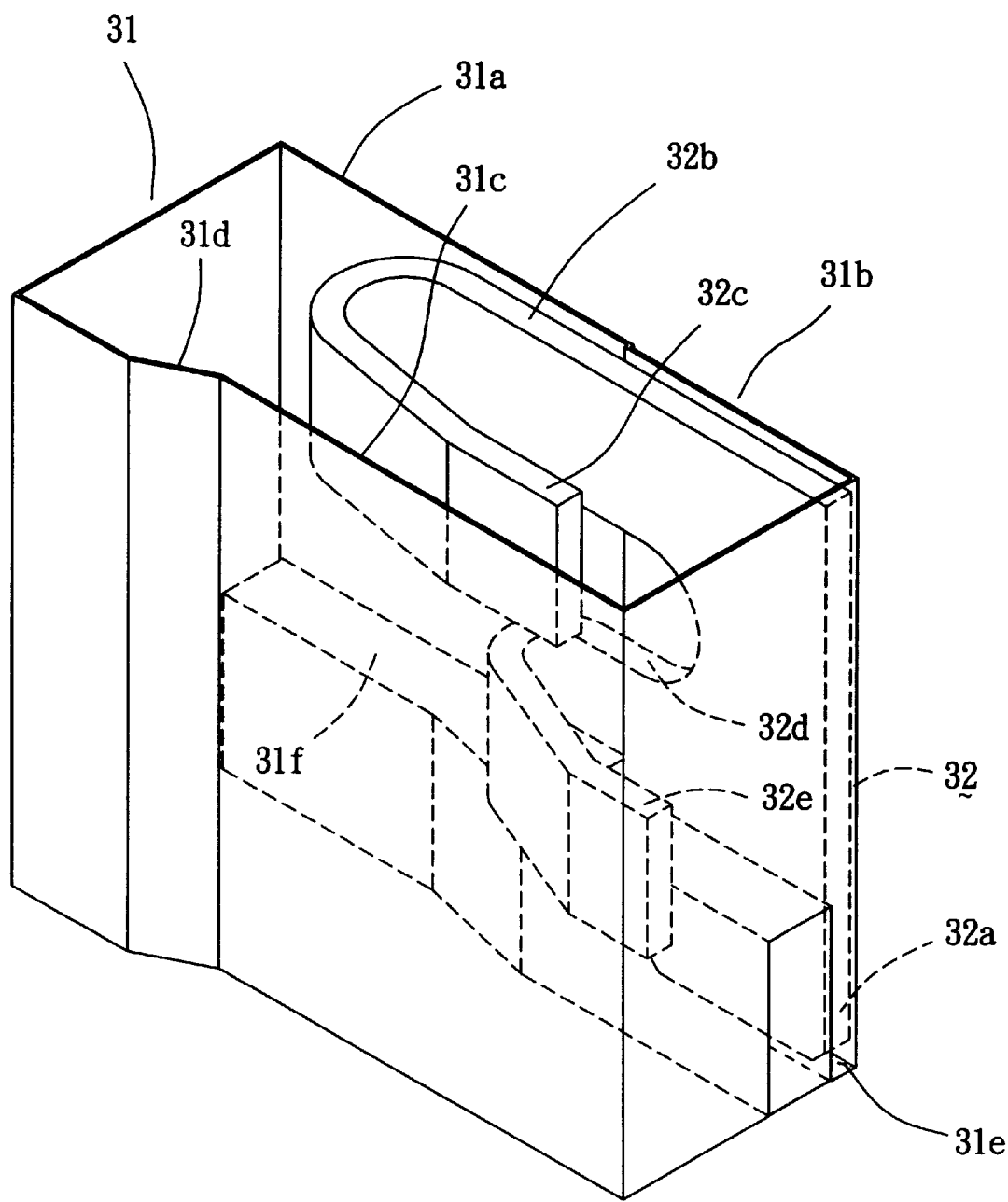
FIG. 3C is a perspective view of the bridging terminal and the terminal cell after the bridging terminal is seated within the terminal cell.

Also referring to FIG. 3B, a bridging terminal 32 is securely retained within the cell 31. The bridging terminal 32 includes a leg portion 32a securely retained within a retaining recess 31e of the cell 31. The bridging terminal 32 forms a first connecting arm 32b having a first flexible end 32c, and a second connecting arm 32d having a second flexible end 32e. A lower edge of the second flexible arm 32d abuts a shoulder 31f of the cell 31 when the leg portion 32a is seated in the retaining recess 31e of the cell 31 (FIG. 3C).

Figure 4A:
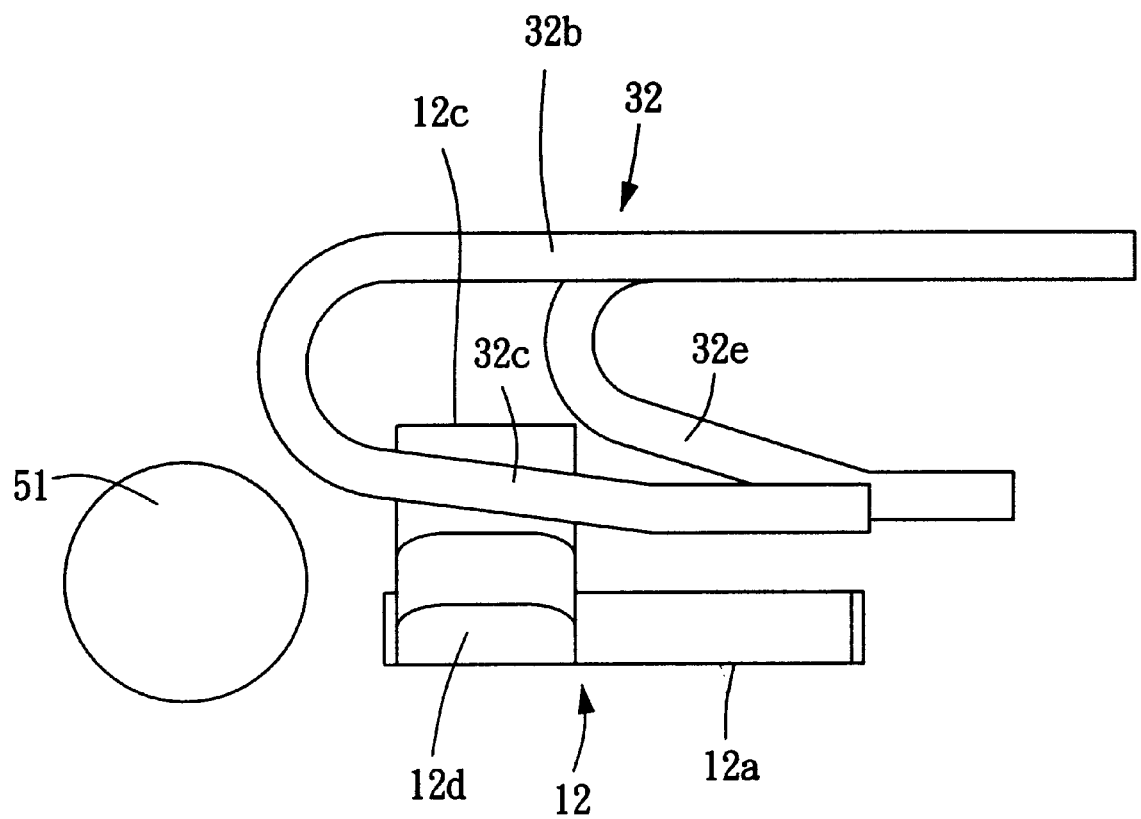
FIG. 4A is a top view of the connecting pin, the metal post, and the bridging terminal before electrical connection.
Figure 4B:
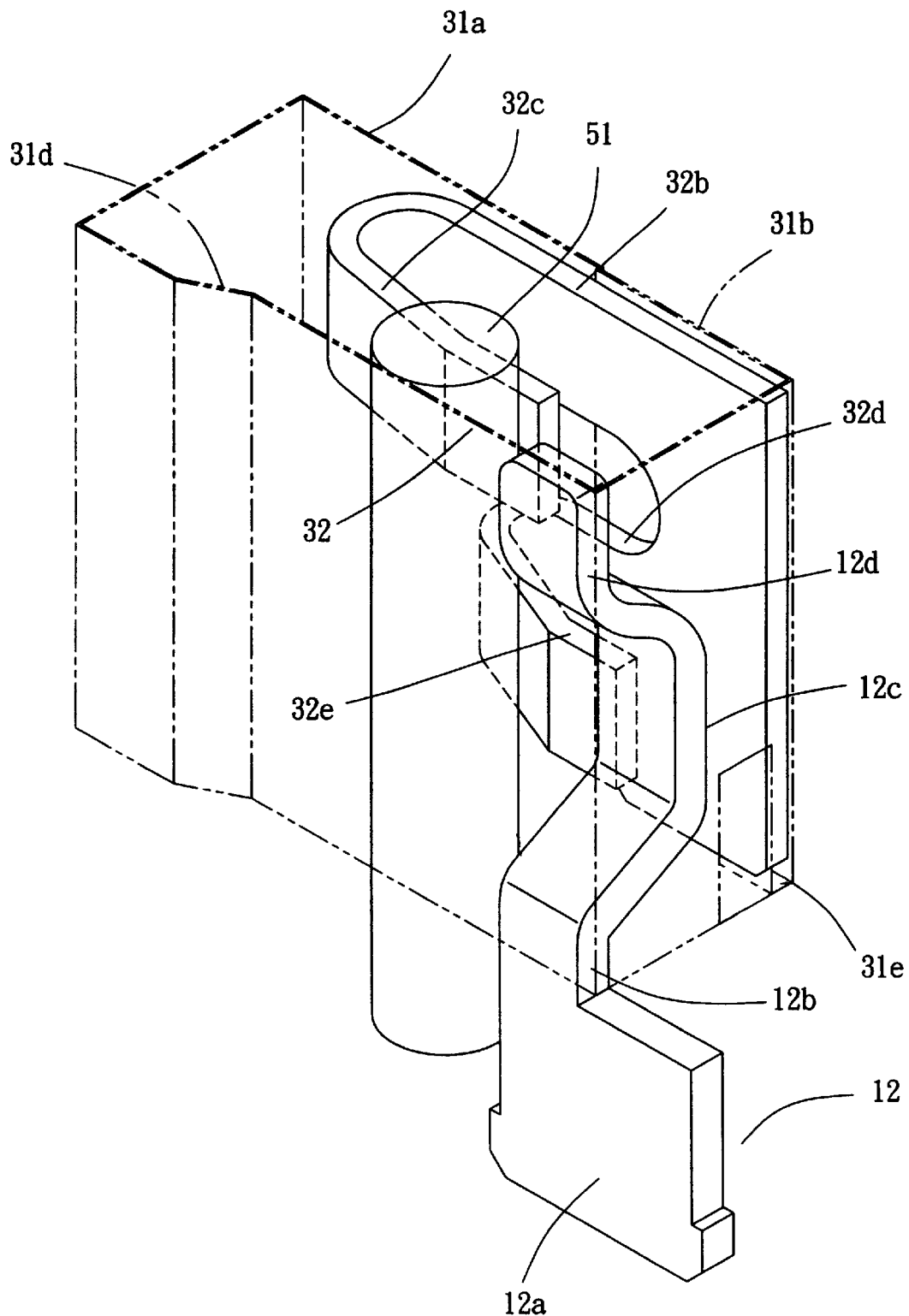
FIG. 4B is still a top view a relative position between the connecting pin, the metal post, and the bridging terminal after electrical connection.
Figure 4C:
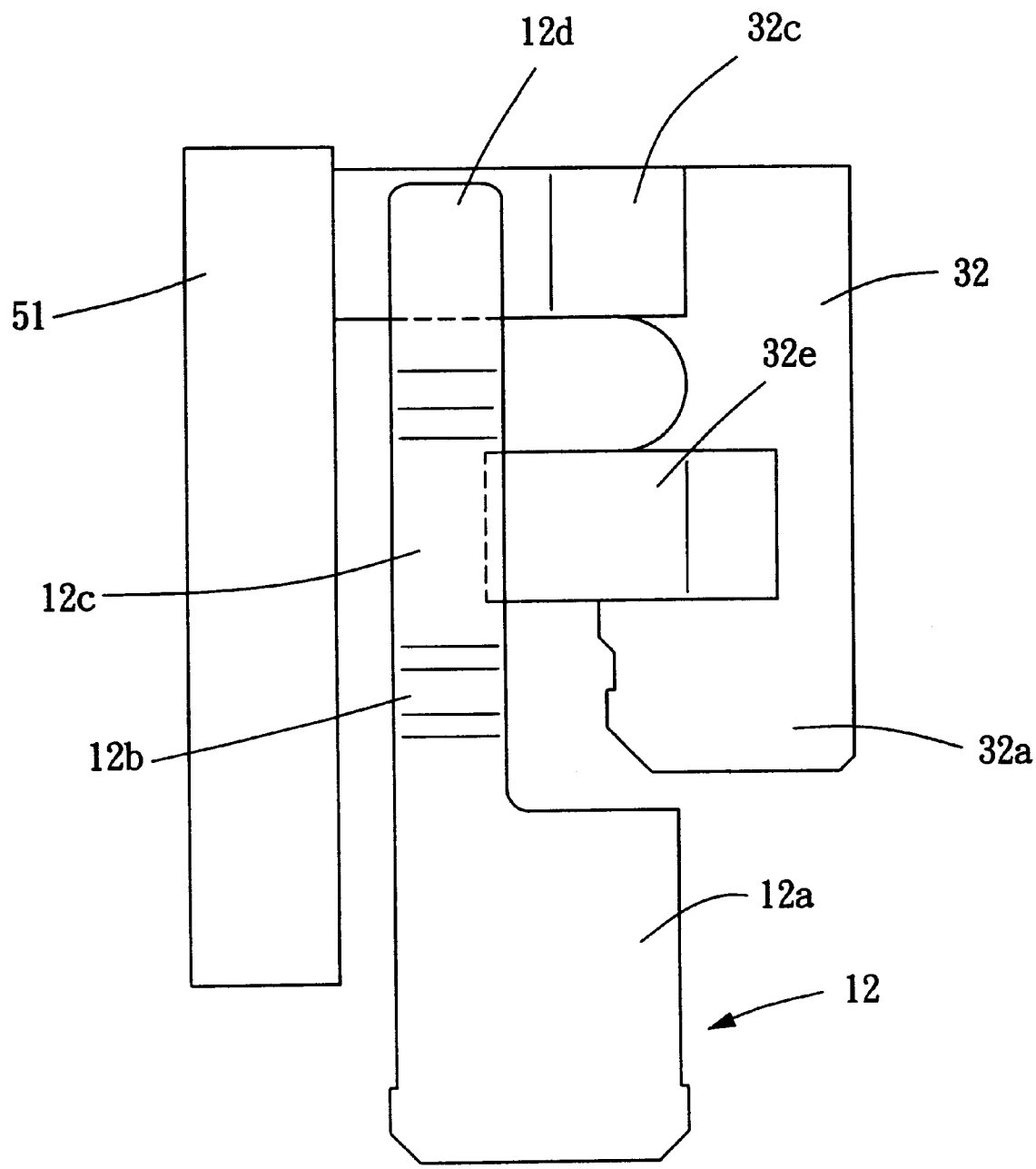
FIG. 4C is a side view of the connecting pin, the metal post, and the bridging terminal before electrical connection.
Figure 4D:
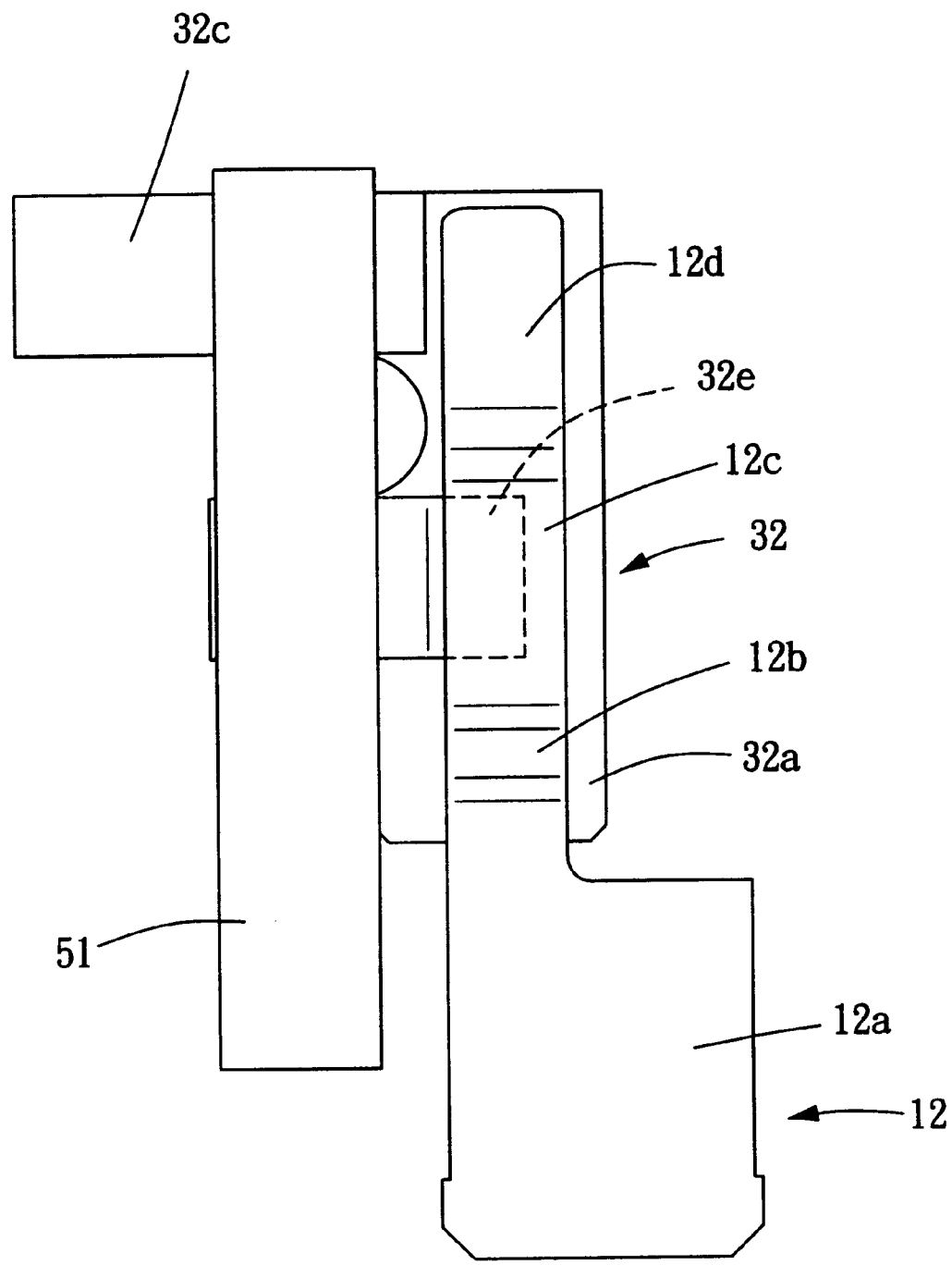
FIG. 4D is a side view of the connecting pin, the metal post, and the bridging terminal after electrical connection.

When the slide member 30 is at the first position as seen in FIGS. 4A and 4C, the connecting pin 51 and the metal post 12 are not electrically connected by the bridging terminal 32. When the slide member 30 is displaced from the first position to the second position by the actuating means 40, the connecting pin 51 and the metal post 12 are electrically connected by the bridging terminal 32 as seen in FIGS. 4B and 4D.

Figure 5A:
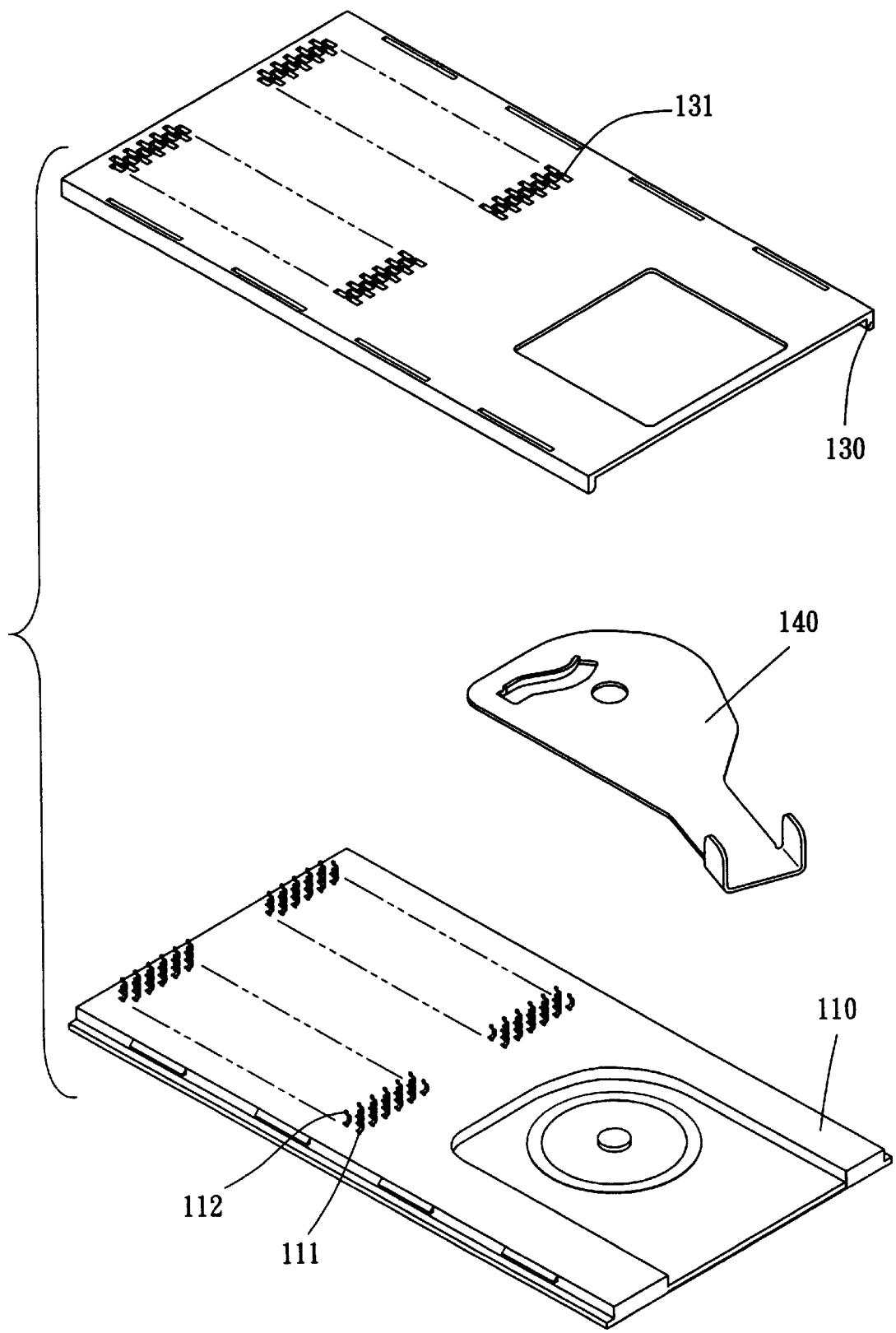
FIG. 5A is an exploded view of an electrical apparatus in accordance with a second embodiment of the present invention.
Figure 5B:
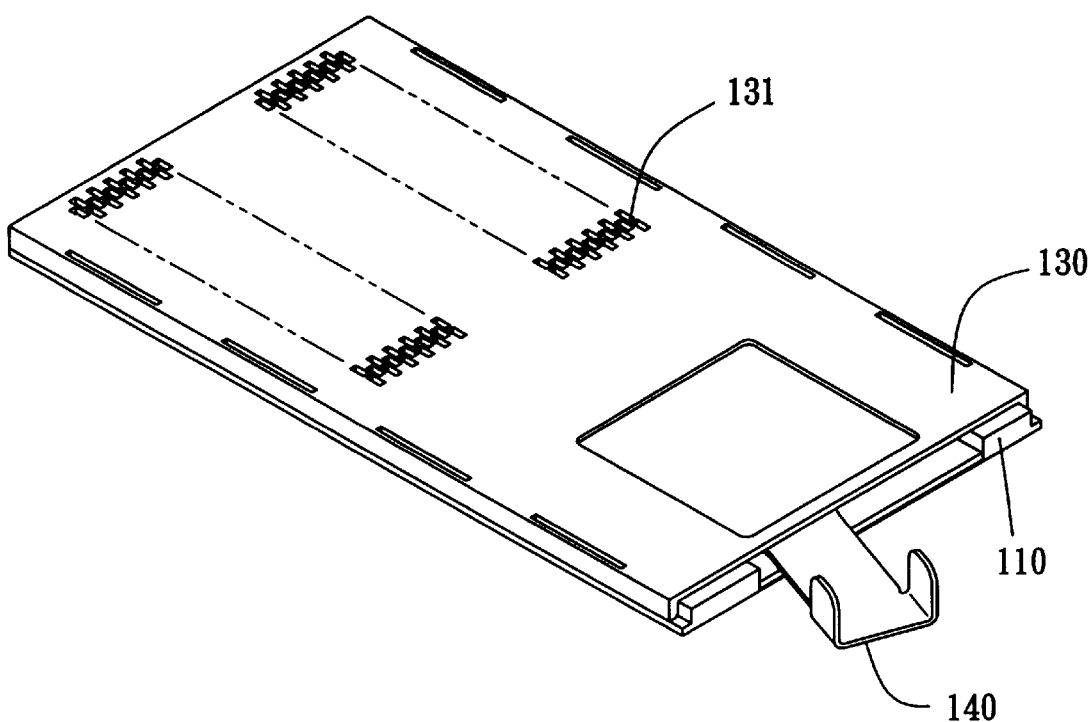
FIG. 5B is an assembled view of the an electrical apparatus of FIG. 5A.
Figure 5C:
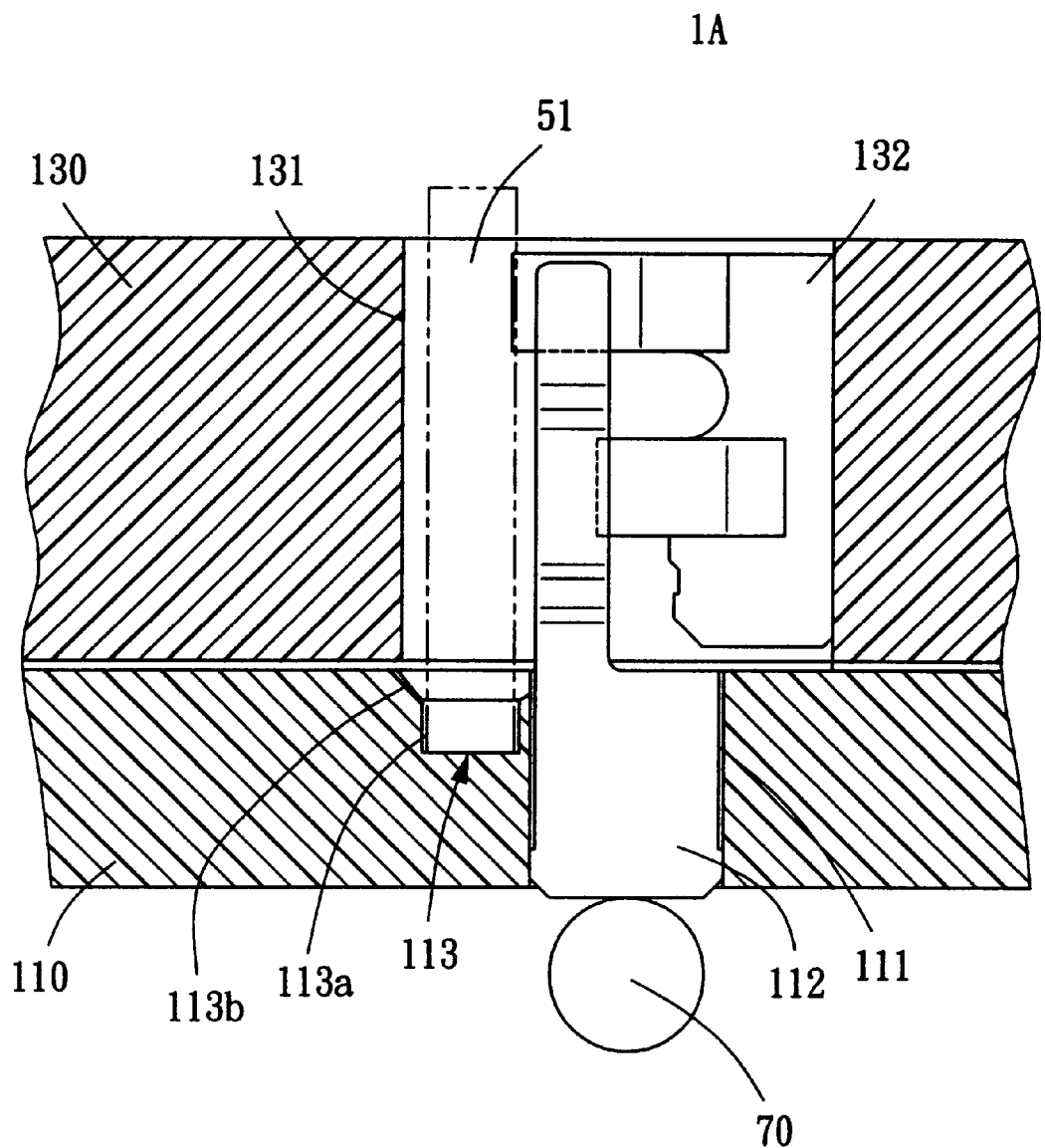
FIG. 5C is a cross sectional view of a terminal cell of the electrical apparatus of FIG. 5A.

Referring to FIGS. 5A to 5C, an electrical apparatus 1A in accordance with a second embodiment of the present invention comprises a base member 110 and a slide member 130 movably disposed on the base member 110. Actuating means 140 is disposed between the base member 110 and the slide member 130 for displacing the slide member between a first position and a second position.

The slide member 130 is provided with an array of terminal cell 131 which have the same configuration of as the terminal cells 31 of the first embodiment and a bridging terminal 132 is securely disposed therein. The base member 110 defines an array of passageways 111 each receiving a metal post 112 therein. Positioning means 113 is arranged on the base member 110 for securely holding connecting pins 51 of a CPU. The positioning means 113 is a recess 113a receiving the corresponding connecting pin 51 through a flared entrance 113b for facilitating insertion thereof. When the slide member 130 is displaced along the base member 110 from the first position to the second position, the CPU remains stationary. By this arrangement, the connecting pins 51 of the CPU are electrically connected to the metal posts 112.

Figure 5D:
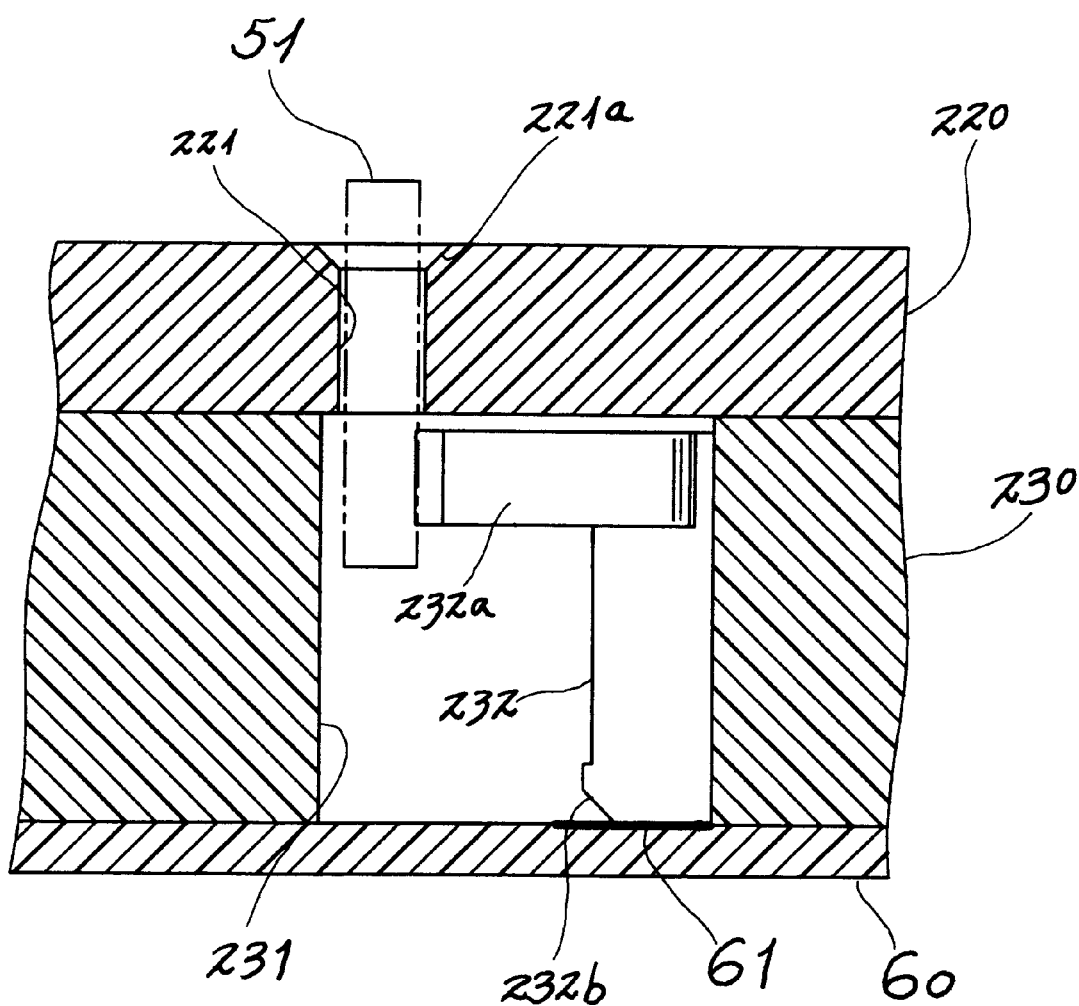
FIG. 5D is a cross sectional view of a terminal cell of an electrical apparatus in accordance with a third embodiment of the invention.

Referring to FIG. 5D, an electrical apparatus 1B in accordance with a third embodiment of the present invention includes a cover member 220 securely attached to a frame or a printed circuit board 60. The cover member 220 defines an array of through holes 221 for receiving connecting pins 51 of a CPU. The slide member 230 is movably disposed between the cover member 220 of the PCB 60. The slide member 230 forms an array of terminal cells 231 corresponding to the array of through holes 221. Each terminal cell 231 securely receives a bridging terminal 232 therein. The bridging terminal 232 forms a connecting aim 232a for connection with the connecting pin 51 of the CPU. The lower end 232b of the bridging terminal 232 is electrically connected with a conducting pad 61 of the PCB 60. By this arrangement, the connecting pins 51 of the CPU are electrically connected to the conductive pads 61 of the PCB 60 when the bridging terminals 232 are at the second position, while the connecting pins 51 of the CPU are disconnected from the conductive pads 61 of the PCB 60 when the bridging terminals are at the first position.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. An electrical apparatus, comprising:
   an electrical device including at least a first terminal;
   a carrier for electrically connecting said electrical device to a printed circuit board having at least a conductive contact, including a bridging terminal disposed between said first terminal and said conductive contact, said bridging terminal being arranged to be selectively displaced between a first position at which said first terminal and said conductive contact are not electrically connected, and a second position at which said first terminal and said conductive contact are electrically connected by said bridging terminal.

2. An electrical apparatus as recited in claim 1, wherein said carrier comprises:
   a slide member defining an array of terminal cells corresponding to said first terminals of said electrical device, each terminal cell securely receiving said corresponding bridging terminal therein; and
   a cover member supporting said electrical device, said cover member defining an array of through holes corresponding to said terminal cells of said slide member, each hole receiving said corresponding first terminal therethrough;
   wherein said slide member is movable with respect to said cover member between the first position at which said first terminals are not electrically connected with said conductive contact of said printed circuit board, and the second position at which said first terminals are electrically connected with said conductive contact by means of said bridging terminal.

3. An electrical apparatus as recited in claim 2, said carrier further comprising:
   a base member fixedly mounted on said printed circuit board, said base member including an array of metal posts corresponding to said terminal cells, an end of each metal post being electrically connected with said corresponding conductive contact, and another end being electrically connected with said corresponding bridging terminal which said slide member has displaced to said second position.

4. An electrical apparatus as recited in claim 3, wherein said cover member is securely assembled to said base member and said slide member is movably sandwiched between said cover and base members.

5. An electrical apparatus for electrically assembling a CPU to a printed circuit board, said CPU forming an array of first terminals, comprising:
   a base member adapted to be securely assembled to said printed circuit board and including an array of metal posts corresponding to said array of first terminals, an end of each metal post being electrically connected to a conductive contact of said printed circuit board;
   a cover member securely assembled to said base member and defining a receiving slot between said cover and base members, said cover member defining an array of through holes corresponding to said array of first terminals whereby the CPU can be seated on the cover and the first terminals can extend through the corresponding through holes toward the base; and
   a slide member movably arranged within said receiving slot, said slide member defining an array of terminal cells corresponding to said array of first terminals, each cell securely receiving a bridging terminal therein, said slide member being selectively displaced between a first position at which said first terminals are not electrically connected with said metal posts, and a second position at which said first terminals are electrically connected with said metal posts by means of said bridging terminals.

6. An electrical apparatus as recited in claim 5, wherein each said first terminal extends into said corresponding terminal cell and being electrically connected with said bridging terminal when said bridging terminal is at the second position.

7. An electrical apparatus as recited in claim 5, wherein another end of said metal post extends into said terminal cell for being electrically connected to said bridging terminal when said slider member is at the second position.

8. An electrical system, comprising:
   a printed circuit board; and
   an electrical connector, comprising:
      a base member securely assembled to the printed circuit board, said base member including an array of metal posts electrically connecting with the printed board;
      a cover member securely assembled to said base member and defining a receiving slot between said cover and base members and an array of through holes;
      a slide member movably arranged within said receiving slot, said slide member defining an array of terminal cells corresponding to said array of through holes and each securely receiving a bridging terminal therein;
      a CPU fixedly mounted on said cover member and having a number of terminals extending through said through holes into said terminal cells; and
      actuating means for selectively displacing said slide member between a first position at which said first terminals of said CPU and said metal posts of said base member are not connected, and a second position at which said terminals of CPU are electrically connected with said metal posts of said base member via said terminal bridges.

9. A carrier for electrically attaching a CPU to a printed circuit board having an array of conductive contacts thereon, said CPU including an array of first terminals, comprising:
   a first member defining an array of through holes and each receiving a first terminal therein, said first member being fixedly assembled to said printed circuit board, a receiving slot being defined between said first member and said printed circuit board;
   a second member movably arranged within said receiving slot, said second member defining an array of terminal cells corresponding to said array of through holes, each terminal cell securely receiving a bridging terminal arranged between said first terminal to said conductive contact, said second member being selectively displaced between a first position at which said first terminal is not electrically connected with said conductive contact, and a second position at which said first terminal is electrically connected with said conductive contact.

10. A carrier for electrically attaching a CPU to a printed circuit board having conductive contacts thereon, said CPU including an array of first terminals, comprising:
   a first member defining an array of terminal cells corresponding to said array of first terminals, each terminal cell securely receiving a bridging terminal arranged between said first terminal to said conductive contact; and
   a second member being fixedly assembled to a printed circuit board and movably supporting said first member, positioning means being formed on said second member for securely holding said first terminal of said CPU; and said first member being selectively displaced between a first position at which said first terminal is not electrically connected with said conductive contact, and a second position at which said first terminal is electrically connected with said conductive contact.

11. An electrical apparatus as recited in claim 10, wherein said positioning means is a recess for securely positioning said connecting pin of said CPU.

12. An electrical apparatus as recited in claim 11, wherein said recess forms a flared entrance for facilitating easy insertion of said connecting pin of said CPU.

13. An electrical apparatus as recited in claim 10, wherein said bridging terminal includes a leg portion securely retained within a retaining recess of said terminal cell, a first connecting arm having a first flexible end, and a second connecting arm having a second flexible end extending from the same side of said bridging terminal as said first connecting arm.

14. An electrical apparatus as recited in claim 13, wherein said first and second connecting arms are offset from each other.

15. An electrical apparatus as recited in claim 10, wherein said terminal cell forms a lead-in wall facilitating easy engagement between said connecting pin of said CPU and said bridging terminal.

16. An electrical system as recited in claim 8, further comprising a fastening means for movably assembling said slide member with respect to said cover member and said base member, comprising:

a pair first of locking flanges extending from transverse ends of one of said cover and base members;

a pair of side retaining channels defined on another of said cover and base members, said locking flange being engaged with said receiving channel;

a pair of second locking flanges formed on one of said cover and slide members, each second locking flange forming a locking end; and a pair of guiding grooves defined on another of said cover and said slide member, said second locking flange being movably engaged with said guiding groove whereby said slide member is movable with respect to said cover member.

17. An electrical system as recited in claim 16, wherein said retaining channel forms at least a retaining wedge projecting from a wall thereof.

18. An electrical system as recited in claim 17, wherein said first locking flange forms a retaining recess for securely engaging with said retaining wedge of said retaining channel.

19. An arrangement of electrically connecting a CPU and a PC board in a computer case, comprising:

a CPU including a plurality of CPU terminals extending downward;

a PC board positioned below the CPU, said PC board including a plurality of conductive contacts corresponding to said CPU terminals;

both said CPU and said PC board being secured to a frame of a computer case;

an apparatus positioned between said CPU and said PC board, said apparatus including at least a slide adapted to be moveable relative to the stationary CPU and PC board, a plurality of bridging terminals being moveable along with the slide between a first position at which the CPU terminal and the corresponding conductive contact are not electrically connected, and a second position at which said CPU terminal and the corresponding conductive contacts are electrically connected by said bridging terminal.

20. The arrangement as defined in claim 19, wherein said apparatus further includes a cover and a base fastened with each other and commonly sandwiching the slide therebetween, and said base is fastened to the PC board.

21. An apparatus for connecting a CPU and a PC board, comprising:

a base member including a plurality of conductive members;

a cover fastened to said base member and defining a plurality of through holes;

a slide sandwiched between said base member and said cover and adapted to be moveable relative to said base member and said cover, said slide including a plurality of bridging terminals being moveable along with the slide between a first position at which the bridging terminals do not engage with the corresponding posts, and a second position at which the bridging terminals engage with the corresponding conductive members.

* * * * *